US009666176B2

(12) United States Patent
Milani et al.

(10) Patent No.: US 9,666,176 B2
(45) Date of Patent: May 30, 2017

(54) SYSTEMS AND METHODS FOR ADAPTIVE NOISE CANCELLATION BY ADAPTIVELY SHAPING INTERNAL WHITE NOISE TO TRAIN A SECONDARY PATH

(71) Applicant: Cirrus Logic, Inc., Austin, TX (US)

(72) Inventors: Ali Abdollahzadeh Milani, Austin, TX (US); Yang Lu, Cedar Park, TX (US); Dayong Zhou, Austin, TX (US); Ning Li, Cedar Park, TX (US)

(73) Assignee: Cirrus Logic, Inc., Austin, TX (US)

( * ) Notice: Subject to any disclaimer, the term of this patent is extended or adjusted under 35 U.S.C. 154(b) by 447 days.

(21) Appl. No.: 14/026,021

(22) Filed: Sep. 13, 2013

(65) Prior Publication Data
US 2015/0078572 A1 Mar. 19, 2015

(51) Int. Cl.
G10K 11/178 (2006.01)
H03F 1/02 (2006.01)
(Continued)

(52) U.S. Cl.
CPC .. *G10K 11/1788* (2013.01); *G10K 2210/1081* (2013.01); *G10K 2210/3045* (2013.01);
(Continued)

(58) Field of Classification Search
CPC ............. G10K 11/178; G10K 11/1788; G10K 2210/1081; G10K 2210/3049; G10K 2210/3045; G10K 2210/30232
(Continued)

(56) References Cited

U.S. PATENT DOCUMENTS 5,117,401 A 5/1992 Feintuch
5,251,263 A 10/1993 Andrea et al.
(Continued)

FOREIGN PATENT DOCUMENTS

CN 101552939 A 10/2009
DE 102011013343 A1 9/2012
(Continued)

OTHER PUBLICATIONS

International Patent Application No. PCT/US2014/049600, International Search Report and Written Opinion, Jan. 14, 2015, 12 pages.
(Continued)

*Primary Examiner* — Davetta W Goins
*Assistant Examiner* — Daniel Sellers
(74) *Attorney, Agent, or Firm* — Jackson Walker L.L.P.

(57) ABSTRACT

A processing circuit may include: (i) an adaptive filter having a response that generates an anti-noise signal from a reference microphone signal, wherein the response is shaped in conformity with the reference microphone signal and a playback corrected error, and wherein the playback corrected error is based on a difference between an error microphone signal and a secondary path estimate; (ii) a secondary path estimate filter configured to model an electro-acoustic path of a source audio signal and having a response that generates a secondary path estimate from the source audio signal; (iii) a secondary coefficient control block that shapes the response of the secondary path estimate filter in conformity with the source audio signal and the playback corrected error by adapting the response of the secondary path estimate filter to minimize the playback corrected error; and (iv) a noise injection portion for injecting a noise signal into the source audio signal, wherein the noise signal is shaped based on the playback corrected error.

21 Claims, 3 Drawing Sheets

(51) Int. Cl.
*H03F 3/181* (2006.01)
*H03F 3/52* (2006.01)

(52) U.S. Cl.
CPC ............... *G10K 2210/3049* (2013.01); *G10K 2210/30232* (2013.01); *H03F 1/0211* (2013.01); *H03F 3/181* (2013.01); *H03F 3/52* (2013.01)

(58) Field of Classification Search
USPC .................................................. 381/71.11
See application file for complete search history.

(56) References Cited

U.S. PATENT DOCUMENTS

| | | | |
|---|---|---|---|
| 5,278,913 A | 1/1994 | Delfosse et al. |
| 5,321,759 A | 6/1994 | Yuan |
| 5,337,365 A | 8/1994 | Hamabe et al. |
| 5,359,662 A | 10/1994 | Yuan et al. |
| 5,377,276 A | 12/1994 | Terai et al. |
| 5,410,605 A | 4/1995 | Sawada et al. |
| 5,425,105 A | 6/1995 | Lo et al. |
| 5,445,517 A | 8/1995 | Kondou et al. |
| 5,465,413 A | 11/1995 | Enge et al. |
| 5,481,615 A | 1/1996 | Eatwell et al. |
| 5,548,681 A | 8/1996 | Gleaves et al. |
| 5,559,893 A | 9/1996 | Krokstad |
| 5,563,819 A | 10/1996 | Nelson |
| 5,586,190 A | 12/1996 | Trantow et al. |
| 5,633,795 A | 5/1997 | Popovich |
| 5,640,450 A | 6/1997 | Watanabe |
| 5,668,747 A | 9/1997 | Ohashi |
| 5,696,831 A | 12/1997 | Inanga |
| 5,699,437 A | 12/1997 | Finn |
| 5,706,344 A | 1/1998 | Finn |
| 5,740,256 A | 4/1998 | Castello Da Costa et al. |
| 5,768,124 A | 6/1998 | Stothers et al. |
| 5,809,152 A | 9/1998 | Nakamura et al. |
| 5,815,582 A | 9/1998 | Claybaugh et al. |
| 5,832,095 A | 11/1998 | Daniels |
| 5,909,498 A | 6/1999 | Smith |
| 5,940,519 A | 8/1999 | Kuo |
| 5,946,391 A | 8/1999 | Dragwidge et al. |
| 5,991,418 A | 11/1999 | Kuo |
| 6,041,126 A | 3/2000 | Terai et al. |
| 6,118,878 A | 9/2000 | Jones |
| 6,185,300 B1 | 2/2001 | Romesburg |
| 6,219,427 B1 | 4/2001 | Kates et al. |
| 6,278,786 B1 | 8/2001 | McIntosh |
| 6,282,176 B1 | 8/2001 | Hemkumar |
| 6,317,501 B1 | 11/2001 | Matsuo |
| 6,418,228 B1 | 7/2002 | Terai et al. |
| 6,434,246 B1 | 8/2002 | Kates et al. |
| 6,434,247 B1 | 8/2002 | Kates et al. |
| 6,522,746 B1 | 2/2003 | Marchok et al. |
| 6,683,960 B1 | 1/2004 | Fujii et al. |
| 6,766,292 B1 | 7/2004 | Chandran et al. |
| 6,768,795 B2 | 7/2004 | Feltstrom et al. |
| 6,850,617 B1 | 2/2005 | Weigand |
| 6,940,982 B1 | 9/2005 | Watkins |
| 7,034,614 B2 | 4/2006 | Robinson et al. |
| 7,058,463 B1 | 6/2006 | Ruha et al. |
| 7,103,188 B1 | 9/2006 | Jones |
| 7,110,864 B2 | 9/2006 | Restrepo et al. |
| 7,181,030 B2 | 2/2007 | Rasmussen et al. |
| 7,330,739 B2 | 2/2008 | Somayajula |
| 7,365,669 B1 | 4/2008 | Melanson |
| 7,368,918 B2 | 5/2008 | Henson et al. |
| 7,406,179 B2 | 7/2008 | Ryan |
| 7,441,173 B2 | 10/2008 | Restrepo et al. |
| 7,466,838 B1 | 12/2008 | Mosely |
| 7,555,081 B2 | 6/2009 | Keele, Jr. |
| 7,680,456 B2 | 3/2010 | Muhammad et al. |
| 7,742,790 B2 | 6/2010 | Konchitsky et al. |
| 7,817,808 B2 | 10/2010 | Konchitsky et al. |
| 7,885,417 B2 * | 2/2011 | Christoph .......... G10K 11/1788 381/56 |
| 8,019,050 B2 | 9/2011 | Mactavish et al. |
| 8,155,334 B2 | 4/2012 | Joho et al. |
| 8,249,262 B2 | 8/2012 | Chua et al. |
| 8,254,589 B2 | 8/2012 | Mitsuhata |
| 8,290,537 B2 | 10/2012 | Lee et al. |
| 8,311,243 B2 | 11/2012 | Tucker et al. |
| 8,325,934 B2 | 12/2012 | Kuo |
| 8,363,856 B2 | 1/2013 | Lesso |
| 8,374,358 B2 | 2/2013 | Buck et al. |
| 8,379,884 B2 | 2/2013 | Horibe et al. |
| 8,401,200 B2 | 3/2013 | Tiscareno et al. |
| 8,442,251 B2 | 5/2013 | Jensen et al. |
| 8,526,627 B2 | 9/2013 | Asao et al. |
| 8,526,628 B1 | 9/2013 | Massie et al. |
| 8,532,310 B2 | 9/2013 | Gauger, Jr. et al. |
| 8,539,012 B2 | 9/2013 | Clark |
| 8,804,974 B1 | 8/2014 | Melanson |
| 8,848,936 B2 | 9/2014 | Kwatra et al. |
| 8,907,829 B1 | 12/2014 | Naderi |
| 8,908,877 B2 | 12/2014 | Abdollahzadeh Milani et al. |
| 8,909,524 B2 | 12/2014 | Stoltz et al. |
| 8,942,976 B2 | 1/2015 | Li et al. |
| 8,948,407 B2 | 2/2015 | Alderson et al. |
| 8,948,410 B2 | 2/2015 | Van Leest |
| 8,958,571 B2 | 2/2015 | Kwatra et al. |
| 8,977,545 B2 | 3/2015 | Zeng et al. |
| 9,020,160 B2 | 4/2015 | Gauger, Jr. |
| 9,066,176 B2 | 6/2015 | Hendrix et al. |
| 9,082,391 B2 | 7/2015 | Yermech et al. |
| 9,094,744 B1 | 7/2015 | Lu et al. |
| 9,106,989 B2 | 8/2015 | Li et al. |
| 9,107,010 B2 | 8/2015 | Abdollahzadeh Milani et al. |
| 9,203,366 B2 | 12/2015 | Eastty |
| 9,264,808 B2 | 2/2016 | Zhou et al. |
| 9,294,836 B2 | 3/2016 | Zhou et al. |
| 2001/0053228 A1 | 12/2001 | Jones |
| 2002/0003887 A1 | 1/2002 | Zhang et al. |
| 2003/0063759 A1 | 4/2003 | Brennan et al. |
| 2003/0072439 A1 | 4/2003 | Gupta |
| 2003/0185403 A1 | 10/2003 | Sibbald |
| 2004/0001450 A1 | 1/2004 | He et al. |
| 2004/0047464 A1 | 3/2004 | Yu et al. |
| 2004/0120535 A1 | 6/2004 | Woods |
| 2004/0165736 A1 | 8/2004 | Hetherington et al. |
| 2004/0167777 A1 | 8/2004 | Hetherington et al. |
| 2004/0176955 A1 | 9/2004 | Farinelli, Jr. et al. |
| 2004/0196992 A1 | 10/2004 | Ryan |
| 2004/0202333 A1 | 10/2004 | Csermak et al. |
| 2004/0240677 A1 | 12/2004 | Onishi et al. |
| 2004/0242160 A1 | 12/2004 | Ichikawa et al. |
| 2004/0264706 A1 | 12/2004 | Ray et al. |
| 2005/0004796 A1 | 1/2005 | Trump et al. |
| 2005/0018862 A1 | 1/2005 | Fisher |
| 2005/0117754 A1 | 6/2005 | Sakawaki |
| 2005/0207585 A1 | 9/2005 | Christoph |
| 2005/0240401 A1 | 10/2005 | Ebenezer |
| 2006/0013408 A1 | 1/2006 | Lee |
| 2006/0018460 A1 | 1/2006 | McCree |
| 2006/0035593 A1 | 2/2006 | Leeds |
| 2006/0055910 A1 | 3/2006 | Lee |
| 2006/0069556 A1 | 3/2006 | Nadjar et al. |
| 2006/0109941 A1 | 5/2006 | Keele, Jr. |
| 2006/0153400 A1 | 7/2006 | Fujita et al. |
| 2007/0030989 A1 | 2/2007 | Kates |
| 2007/0033029 A1 | 2/2007 | Sakawaki |
| 2007/0038441 A1 | 2/2007 | Inoue et al. |
| 2007/0047742 A1 | 3/2007 | Taenzer et al. |
| 2007/0053524 A1 | 3/2007 | Haulick et al. |
| 2007/0076896 A1 | 4/2007 | Hosaka et al. |
| 2007/0154031 A1 | 7/2007 | Avendano et al. |
| 2007/0208520 A1 | 9/2007 | Zhang et al. |
| 2007/0258597 A1 | 11/2007 | Rasmussen et al. |
| 2007/0297620 A1 | 12/2007 | Choy |
| 2008/0019548 A1 | 1/2008 | Avendano |
| 2008/0101589 A1 | 5/2008 | Horowitz et al. |
| 2008/0107281 A1 | 5/2008 | Togami et al. |
| 2008/0144853 A1 | 6/2008 | Sommerfeldt et al. |

(56) References Cited

U.S. PATENT DOCUMENTS

| | | |
|---|---|---|
| 2008/0166002 A1 | 7/2008 | Amsel |
| 2008/0177532 A1 | 7/2008 | Greiss et al. |
| 2008/0181422 A1* | 7/2008 | Christoph ............ G10K 11/1784 381/73.1 |
| 2008/0226098 A1 | 9/2008 | Haulick et al. |
| 2008/0240413 A1 | 10/2008 | Mohammad et al. |
| 2008/0240455 A1 | 10/2008 | Inoue et al. |
| 2008/0240457 A1 | 10/2008 | Innoue et al. |
| 2009/0012783 A1 | 1/2009 | Klein |
| 2009/0034748 A1 | 2/2009 | Sibbald |
| 2009/0041260 A1 | 2/2009 | Jorgensen et al. |
| 2009/0046867 A1 | 2/2009 | Clemow |
| 2009/0060222 A1 | 3/2009 | Jeong et al. |
| 2009/0080670 A1 | 3/2009 | Solbeck et al. |
| 2009/0086990 A1 | 4/2009 | Christoph |
| 2009/0136057 A1 | 5/2009 | Taenzer |
| 2009/0175461 A1 | 7/2009 | Nakamura et al. |
| 2009/0175466 A1 | 7/2009 | Elko et al. |
| 2009/0196429 A1 | 8/2009 | Ramakrishnan et al. |
| 2009/0220107 A1 | 9/2009 | Every et al. |
| 2009/0238369 A1 | 9/2009 | Ramakrishnan et al. |
| 2009/0245529 A1 | 10/2009 | Asada et al. |
| 2009/0254340 A1 | 10/2009 | Sun et al. |
| 2009/0290718 A1 | 11/2009 | Kahn et al. |
| 2009/0296965 A1 | 12/2009 | Kojima |
| 2009/0304200 A1 | 12/2009 | Kim et al. |
| 2009/0311979 A1 | 12/2009 | Husted et al. |
| 2010/0014683 A1 | 1/2010 | Maeda et al. |
| 2010/0014685 A1 | 1/2010 | Wurm |
| 2010/0061564 A1 | 3/2010 | Clemow et al. |
| 2010/0069114 A1 | 3/2010 | Lee et al. |
| 2010/0082339 A1 | 4/2010 | Konchitsky et al. |
| 2010/0098263 A1 | 4/2010 | Pan et al. |
| 2010/0098265 A1 | 4/2010 | Pan et al. |
| 2010/0124336 A1 | 5/2010 | Shridhar et al. |
| 2010/0124337 A1 | 5/2010 | Wertz et al. |
| 2010/0131269 A1 | 5/2010 | Park et al. |
| 2010/0142715 A1 | 6/2010 | Goldstein et al. |
| 2010/0150367 A1 | 6/2010 | Mizuno |
| 2010/0158330 A1 | 6/2010 | Guissin et al. |
| 2010/0166203 A1 | 7/2010 | Peissig et al. |
| 2010/0183175 A1 | 7/2010 | Chen et al. |
| 2010/0195838 A1 | 8/2010 | Bright |
| 2010/0195844 A1 | 8/2010 | Christoph et al. |
| 2010/0207317 A1 | 8/2010 | Iwami et al. |
| 2010/0226210 A1 | 9/2010 | Kordis et al. |
| 2010/0246855 A1 | 9/2010 | Chen |
| 2010/0266137 A1 | 10/2010 | Sibbald et al. |
| 2010/0272276 A1 | 10/2010 | Carreras et al. |
| 2010/0272283 A1 | 10/2010 | Carreras et al. |
| 2010/0272284 A1 | 10/2010 | Joho et al. |
| 2010/0274564 A1 | 10/2010 | Bakalos et al. |
| 2010/0284546 A1 | 11/2010 | DeBrunner et al. |
| 2010/0291891 A1 | 11/2010 | Ridgers et al. |
| 2010/0296666 A1 | 11/2010 | Lin |
| 2010/0296668 A1 | 11/2010 | Lee et al. |
| 2010/0310086 A1 | 12/2010 | Magrath et al. |
| 2010/0310087 A1 | 12/2010 | Ishida |
| 2010/0316225 A1 | 12/2010 | Saito |
| 2010/0322430 A1 | 12/2010 | Isberg |
| 2011/0002468 A1 | 1/2011 | Tanghe |
| 2011/0007907 A1 | 1/2011 | Park et al. |
| 2011/0026724 A1 | 2/2011 | Doclo |
| 2011/0091047 A1 | 4/2011 | Konchitsky et al. |
| 2011/0096933 A1 | 4/2011 | Eastty |
| 2011/0099010 A1 | 4/2011 | Zhang |
| 2011/0106533 A1 | 5/2011 | Yu |
| 2011/0116643 A1 | 5/2011 | Tiscareno |
| 2011/0129098 A1 | 6/2011 | Delano et al. |
| 2011/0130176 A1 | 6/2011 | Magrath et al. |
| 2011/0142247 A1 | 6/2011 | Fellers et al. |
| 2011/0144984 A1 | 6/2011 | Konchitsky |
| 2011/0150257 A1* | 6/2011 | Jensen ................ H04R 25/453 381/318 |
| 2011/0158419 A1 | 6/2011 | Theverapperuma et al. |
| 2011/0206214 A1 | 8/2011 | Christoph et al. |
| 2011/0222698 A1 | 9/2011 | Asao et al. |
| 2011/0222701 A1 | 9/2011 | Donaldson et al. |
| 2011/0249826 A1 | 10/2011 | Van Leest |
| 2011/0288860 A1 | 11/2011 | Schevciw et al. |
| 2011/0293103 A1 | 12/2011 | Park et al. |
| 2011/0299695 A1 | 12/2011 | Nicholson |
| 2011/0305347 A1 | 12/2011 | Wurm |
| 2011/0317848 A1 | 12/2011 | Ivanov et al. |
| 2012/0057720 A1 | 3/2012 | Van Leest |
| 2012/0084080 A1 | 4/2012 | Konchitsky et al. |
| 2012/0135787 A1 | 5/2012 | Kusunoki et al. |
| 2012/0140917 A1 | 6/2012 | Nicholson et al. |
| 2012/0140942 A1 | 6/2012 | Loeda |
| 2012/0140943 A1 | 6/2012 | Hendrix et al. |
| 2012/0148062 A1 | 6/2012 | Scarlett et al. |
| 2012/0155666 A1 | 6/2012 | Nair |
| 2012/0170766 A1 | 7/2012 | Alves et al. |
| 2012/0179458 A1 | 7/2012 | Oh et al. |
| 2012/0185524 A1 | 7/2012 | Clark |
| 2012/0207317 A1 | 8/2012 | Abdollahzadeh Milani et al. |
| 2012/0215519 A1 | 8/2012 | Park et al. |
| 2012/0250873 A1 | 10/2012 | Bakalos et al. |
| 2012/0259626 A1 | 10/2012 | Li et al. |
| 2012/0263317 A1 | 10/2012 | Shin et al. |
| 2012/0281850 A1 | 11/2012 | Hyatt |
| 2012/0300955 A1 | 11/2012 | Iseki et al. |
| 2012/0300958 A1 | 11/2012 | Klemmensen |
| 2012/0300960 A1 | 11/2012 | Mackay et al. |
| 2012/0308021 A1 | 12/2012 | Kwatra et al. |
| 2012/0308024 A1 | 12/2012 | Alderson et al. |
| 2012/0308025 A1 | 12/2012 | Hendrix et al. |
| 2012/0308026 A1 | 12/2012 | Kamath et al. |
| 2012/0308027 A1 | 12/2012 | Kwatra |
| 2012/0308028 A1 | 12/2012 | Kwatra et al. |
| 2012/0310640 A1 | 12/2012 | Kwatra et al. |
| 2012/0316872 A1 | 12/2012 | Stoltz et al. |
| 2013/0010982 A1 | 1/2013 | Elko et al. |
| 2013/0083939 A1 | 4/2013 | Fellers et al. |
| 2013/0156238 A1 | 6/2013 | Birch et al. |
| 2013/0195282 A1 | 8/2013 | Ohita et al. |
| 2013/0222516 A1 | 8/2013 | Do et al. |
| 2013/0243198 A1 | 9/2013 | Van Rumpt |
| 2013/0243225 A1 | 9/2013 | Yokota |
| 2013/0259251 A1 | 10/2013 | Bakalos |
| 2013/0272539 A1 | 10/2013 | Kim et al. |
| 2013/0287218 A1 | 10/2013 | Alderson et al. |
| 2013/0287219 A1 | 10/2013 | Hendrix et al. |
| 2013/0301842 A1 | 11/2013 | Hendrix et al. |
| 2013/0301846 A1 | 11/2013 | Alderson et al. |
| 2013/0301847 A1 | 11/2013 | Alderson et al. |
| 2013/0301848 A1 | 11/2013 | Zhou et al. |
| 2013/0301849 A1 | 11/2013 | Alderson |
| 2013/0315403 A1 | 11/2013 | Samuelsson |
| 2013/0343556 A1 | 12/2013 | Bright |
| 2013/0343571 A1 | 12/2013 | Rayala et al. |
| 2014/0036127 A1 | 2/2014 | Pong et al. |
| 2014/0044275 A1 | 2/2014 | Goldstein et al. |
| 2014/0050332 A1 | 2/2014 | Nielsen et al. |
| 2014/0051483 A1 | 2/2014 | Schoerkmaier |
| 2014/0072134 A1 | 3/2014 | Po et al. |
| 2014/0072135 A1 | 3/2014 | Bajic et al. |
| 2014/0086425 A1 | 3/2014 | Jensen et al. |
| 2014/0126735 A1 | 5/2014 | Gauger, Jr. |
| 2014/0169579 A1 | 6/2014 | Azmi |
| 2014/0177851 A1 | 6/2014 | Kitazawa et al. |
| 2014/0177890 A1 | 6/2014 | Hojlund et al. |
| 2014/0211953 A1 | 7/2014 | Alderson et al. |
| 2014/0226827 A1 | 8/2014 | Abdollahzadeh Milani et al. |
| 2014/0270222 A1 | 9/2014 | Hendrix et al. |
| 2014/0270223 A1 | 9/2014 | Li et al. |
| 2014/0270224 A1 | 9/2014 | Zhou et al. |
| 2014/0294182 A1 | 10/2014 | Axelsson |
| 2014/0307887 A1 | 10/2014 | Alderson et al. |
| 2014/0307888 A1 | 10/2014 | Alderson et al. |
| 2014/0307890 A1 | 10/2014 | Zhou et al. |
| 2014/0307899 A1 | 10/2014 | Hendrix et al. |
| 2014/0314244 A1 | 10/2014 | Yong et al. |
| 2014/0314246 A1 | 10/2014 | Hellmann |

(56) References Cited

U.S. PATENT DOCUMENTS

| | | |
|---|---|---|
| 2014/0314247 A1 | 10/2014 | Zhang |
| 2014/0341388 A1 | 11/2014 | Goldstein |
| 2014/0369517 A1 | 12/2014 | Zhou et al. |
| 2015/0078572 A1 | 3/2015 | Abdollahzadeh Milani et al. |
| 2015/0092953 A1 | 4/2015 | Abdollahzadeh Milani et al. |
| 2015/0104032 A1 | 4/2015 | Kwatra et al. |
| 2015/0161980 A1 | 6/2015 | Alderson et al. |
| 2015/0161981 A1 | 6/2015 | Kwatra |
| 2015/0163592 A1 | 6/2015 | Alderson |
| 2015/0256660 A1 | 9/2015 | Kaller et al. |
| 2015/0256953 A1 | 9/2015 | Kwatra et al. |
| 2015/0269926 A1 | 9/2015 | Alderson et al. |
| 2015/0365761 A1 | 12/2015 | Alderson |
| 2016/0180830 A1 | 6/2016 | Lu et al. |

FOREIGN PATENT DOCUMENTS

| | | |
|---|---|---|
| EP | 0412902 A2 | 2/1991 |
| EP | 0756407 A2 | 1/1997 |
| EP | 0898266 A2 | 2/1999 |
| EP | 1691577 A2 | 8/2006 |
| EP | 1880699 A2 | 1/2008 |
| EP | 1947642 A1 | 7/2008 |
| EP | 2133866 A1 | 12/2009 |
| EP | 2237573 A1 | 10/2010 |
| EP | 2216774 A1 | 8/2011 |
| EP | 2395500 A1 | 12/2011 |
| EP | 2395501 A1 | 12/2011 |
| EP | 2551845 A1 | 1/2013 |
| EP | 2583074 A1 | 4/2013 |
| EP | 2984648 A2 | 2/2016 |
| EP | 2987160 A1 | 2/2016 |
| EP | 2987162 A1 | 2/2016 |
| EP | 2987337 A1 | 2/2016 |
| GB | 2401744 A | 11/2004 |
| GB | 2436657 A | 10/2007 |
| GB | 2455821 A | 6/2009 |
| GB | 2455824 A | 6/2009 |
| GB | 2455828 A | 6/2009 |
| GB | 2484722 A | 4/2012 |
| JP | H05265468 | 10/1993 |
| JP | 06006246 | 1/1994 |
| JP | H06186985 A | 7/1994 |
| JP | H06232755 | 8/1994 |
| JP | 07098592 | 4/1995 |
| JP | 07325588 A | 12/1995 |
| JP | H07334169 | 12/1995 |
| JP | H08227322 | 9/1996 |
| JP | H10247088 | 9/1998 |
| JP | H10257159 | 9/1998 |
| JP | H11305783 A | 11/1999 |
| JP | 2000089770 | 3/2000 |
| JP | 2002010355 | 1/2002 |
| JP | 2004007107 | 1/2004 |
| JP | 2006217542 A | 8/2006 |
| JP | 2007060644 | 3/2007 |
| JP | 2008015046 A | 1/2008 |
| JP | 2010277025 | 12/2010 |
| JP | 2011061449 | 3/2011 |
| WO | 9304529 A1 | 3/1993 |
| WO | 9911045 | 3/1999 |
| WO | 03015074 A1 | 2/2003 |
| WO | 03015275 A1 | 2/2003 |
| WO | WO2004009007 A1 | 1/2004 |
| WO | 2004017303 A1 | 2/2004 |
| WO | 2006125061 A1 | 11/2006 |
| WO | 2006128768 A1 | 12/2006 |
| WO | 2007007916 A1 | 1/2007 |
| WO | 2007011337 A1 | 1/2007 |
| WO | 2007110807 A2 | 10/2007 |
| WO | 2007113487 A1 | 11/2007 |
| WO | 2009041012 A1 | 4/2009 |
| WO | 2009110087 A1 | 9/2009 |
| WO | 2009155696 A1 | 12/2009 |
| WO | 2010117714 A1 | 10/2010 |
| WO | 2011035061 A1 | 3/2011 |
| WO | 2012107561 A1 | 8/2012 |
| WO | 2012119808 A2 | 9/2012 |
| WO | 2012134874 A1 | 10/2012 |
| WO | 2012166273 A2 | 12/2012 |
| WO | 2012166388 A2 | 12/2012 |
| WO | 2013106370 A1 | 7/2013 |
| WO | 2014158475 A1 | 10/2014 |
| WO | 2014168685 A2 | 10/2014 |
| WO | 2014172005 A1 | 10/2014 |
| WO | 2014172006 A1 | 10/2014 |
| WO | 2014172010 A1 | 10/2014 |
| WO | 2014172019 A1 | 10/2014 |
| WO | 2014172021 A1 | 10/2014 |
| WO | 2014200787 A1 | 12/2014 |
| WO | 2015038255 A1 | 3/2015 |
| WO | 2015088639 A | 6/2015 |
| WO | 2015088651 A1 | 6/2015 |
| WO | 2015088653 A1 | 6/2015 |
| WO | 2015134225 A1 | 9/2015 |
| WO | 2015191691 A1 | 12/2015 |
| WO | 2016054186 A1 | 4/2016 |
| WO | 2016100602 A1 | 6/2016 |

OTHER PUBLICATIONS

International Patent Application No. PCT/US2014/061753, International Search Report and Written Opinion, Feb. 9, 2015, 8 pages.

International Patent Application No. PCT/US2014/061548, International Search Report and Written Opinion, Feb. 12, 2015, 13 pages.

International Patent Application No. PCT/US2014/060277, International Search Report and Written Opinion, Mar. 9, 2015, 11 pages.

Kou, Sen and Tsai, Jianming, Residual noise shaping technique for active noise control systems, J. Acoust. Soc. Am. 95 (3), Mar. 1994, pp. 1665-1668.

Pfann, et al., "LMS Adaptive Filtering with Delta-Sigma Modulated Input Signals," IEEE Signal Processing Letters, Apr. 1998, pp. 95-97, vol. 5, No. 4, IEEE Press, Piscataway, NJ.

Toochinda, et al., "A Single-Input Two-Output Feedback Formulation for ANC Problems," Proceedings of the 2001 American Control Conference, Jun. 2001, pp. 923-928, vol. 2, Arlington, VA.

Kuo, et al., "Active Noise Control: A Tutorial Review," Proceedings of the IEEE, Jun. 1999, pp. 943-973, vol. 87, No. 6, IEEE Press, Piscataway, NJ.

Johns, et al., "Continuous-Time LMS Adaptive Recursive Filters," IEEE Transactions on Circuits and Systems, Jul. 1991, pp. 769-778, vol. 38, No. 7, IEEE Press, Piscataway, NJ.

Shoval, et al., "Comparison of DC Offset Effects in Four LMS Adaptive Algorithms," IEEE Transactions on Circuits and Systems II: Analog and Digital Processing, Mar. 1995, pp. 176-185, vol. 42, Issue 3, IEEE Press, Piscataway, NJ.

Mali, Dilip, "Comparison of DC Offset Effects on LMB Algorithm and its Derivatives," International Journal of Recent Trends in Engineering, May 2009, pp. 323-328, vol. 1, No. 1, Academy Publisher.

Kates, James M., "Principles of Digital Dynamic Range Compression," Trends in Amplification, Spring 2005, pp. 45-76, vol. 9, No. 2, Sage Publications.

Gao, et al., "Adaptive Linearization of a Loudspeaker," IEEE International Conference on Acoustics, Speech, and Signal Processing, Apr. 14-17, 1991, pp. 3589-3592, Toronto, Ontario, CA.

Silva, et al., "Convex Combination of Adaptive Filters With Different Tracking Capabilities," IEEE International Conference on Acoustics, Speech, and Signal Processing, Apr. 15-20, 2007, pp. III 925-928, vol. 3, Honolulu, HI, USA.

Akhtar, et al., "A Method for Online Secondary Path Modeling in Active Noise Control Systems," IEEE International Symposium on Circuits and Systems, May 23-26, 2005, pp. 264-267, vol. 1, Kobe, Japan.

Davari, et al., "A New Online Secondary Path Modeling Method for Feedforward Active Noise Control Systems," IEEE International Conference on Industrial Technology, Apr. 21-24, 2008, pp. 1-6, Chengdu, China.

(56) References Cited

OTHER PUBLICATIONS

Lan, et al., "An Active Noise Control System Using Online Secondary Path Modeling With Reduced Auxiliary Noise," IEEE Signal Processing Letters, Jan. 2002, pp. 16-18, vol. 9, Issue 1, IEEE Press, Piscataway, NJ.

Liu, et al., "Analysis of Online Secondary Path Modeling With Auxiliary Noise Scaled by Residual Noise Signal," IEEE Transactions on Audio, Speech and Language Processing, Nov. 2010, pp. 1978-1993, vol. 18, Issue 8, IEEE Press, Piscataway, NJ.

Booji, P.S., Berkhoff, A.P., Virtual sensors for local, three dimensional, broadband multiple-channel active noise control and the effects on the quiet zones, Proceedings of ISMA2010 including USD2010, pp. 151-166.

Lopez-Caudana, Edgar Omar, Active Noise Cancellation: The Unwanted Signal and the Hybrid Solution, Adaptive Filtering Applications, Dr. Lino Garcia, ISBN: 978-953-307-306-4, InTech.

D. Senderowicz et al., "Low-Voltage Double-Sampled Delta-Sigma Converters," IEEE J. Solid-State Circuits, vol. 32,, No. 12, pp. 1907-1919, Dec. 1997, 13 pages.

Hurst, P.J. and Dyer, K.C., "An improved double sampling scheme for switched-capacitor delta-sigma modulators," IEEE Int. Symp. Circuits Systems, May 1992, vol. 3, pp. 1179-1182, 4 pages.

Milani, et al., "On Maximum Achievable Noise Reduction in ANC Systems", Proceedings of the IEEE International Conference on Acoustics, Speech, and Signal Processing, ICASSP 2010, Mar. 14-19, 2010 pp. 349-352.

Ryan, et al., "Optimum near-field performance of microphone arrays subject to a far-field beampattern constraint", 2248 J. Acoust. Soc. Am. 108, Nov. 2000.

Cohen, et al., "Noise Estimation by Minima Controlled Recursive Averaging for Robust Speech Enhancement", IEEE Signal Processing Letters, vol. 9, No. 1, Jan. 2002.

Martin, "Noise Power Spectral Density Estimation Based on Optimal Smoothing and Minimum Statistics", IEEE Trans. on Speech and Audio Processing, col. 9, No. 5, Jul. 2001.

Martin, "Spectral Subtraction Based on Minimum Statistics", Proc. 7th EUSIPCO '94, Edinburgh, U.K., Sep. 13-16, 1994, pp. 1182-1195.

Cohen, "Noise Spectrum Estimation in Adverse Environments: Improved Minima Controlled Recursive Averaging", IEEE Trans. on Speech & Audio Proc., vol. 11, Issue 5, Sep. 2003.

Black, John W., "An Application of Side-Tone in Subjective Tests of Microphones and Headsets", Project Report No. NM 001 064.01.20, Research Report of the U.S. Naval School of Aviation Medicine, Feb. 1, 1954, 12 pages (pp. 1-12 in pdf), Pensacola, FL, US.

Lane, et al., "Voice Level: Autophonic Scale, Perceived Loudness, and the Effects of Sidetone", The Journal of the Acoustical Society of America, Feb. 1961, pp. 160-167, vol. 33, No. 2., Cambridge, MA, US.

Liu, et al., "Compensatory Responses to Loudness-shifted Voice Feedback During Production of Mandarin Speech", Journal of the Acoustical Society of America, Oct. 2007, pp. 2405-2412, vol. 122, No. 4.

Paepcke, et al., "Yelling in the Hall: Using Sidetone to Address a Problem with Mobile Remote Presence Systems", Symposium on User Interface Software and Technology, Oct. 16-19, 2011, 10 pages (pp. 1-10 in pdf), Santa Barbara, CA, US.

Peters, Robert W., "The Effect of High-Pass and Low-Pass Filtering of Side-Tone Upon Speaker Intelligibility", Project Report No. NM 001 064.01.25, Research Report of the U.S. Naval School of Aviation Medicine, Aug. 16, 1954, 13 pages (pp. 1-13 in pdf), Pensacola, FL, US.

Therrien, et al., "Sensory Attenuation of Self-Produced Feedback: The Lombard Effect Revisited", PLOS One, Nov. 2012, pp. 1-7, vol. 7, Issue 11, e49370, Ontario, Canada.

Ray, Laura et al., Hybrid Feedforward-Feedback Active Noise Reduction for Hearing Protection and Communication, the Journal of the Acoustical Society of America, American Institute of Physics for the Acoustical Society of America, New York, NY, vol. 120, No. 4, Jan. 2006, pp. 2026-2036.

International Patent Application No. PCT/US2014/017112, International Search Report and Written Opinion, May 8, 2015, 22 pages.

Campbell, Mikey, "Apple looking into self-adjusting earbud headphones with noise cancellation tech", Apple Insider, Jul. 4, 2013, pp. 1-10 (10 pages in pdf), downloaded on May 14, 2014 from http://appleinsider.com/articles/13/07/04/apple-looking-into-self-adjusting-earbud-headphones-with-noise-cancellation-tech.

International Patent Application No. PCT/US2014/017096, International Search Report and Written Opinion, May 27, 2014, 11 pages.

Jin, et al., "A simultaneous equation method-based online secondary path modeling algorithm for active noise control", Journal of Sound and Vibration, Apr. 25, 2007, pp. 455-474, vol. 303, No. 3-5, London, GB.

Erkelens et al., "Tracking of Nonstationary Noise Based on Data-Driven Recursive Noise Power Estimation", IEEE Transactions on Audio Speech, and Language Processing, vol. 16, No. 6, Aug. 2008.

Rao et al., "A Novel Two Stage Single Channle Speech Enhancement Technique", India Conference (Indicon) 2011 Annual IEEE, IEEE, Dec. 15, 2011.

Rangachari et al., "A noise-estimation algorithm for highly non-stationary environments" Speech Communication, Elsevier Science Publishers, vol. 48, No. 2, Feb. 1, 2006.

International Search Report and Written Opinion of the International Searching Authority, International Patent Application No. PCT/US2014/017343, mailed Aug. 8, 2014, 22 pages.

International Search Report and Written Opinion of the International Searching Authority, International Patent Application No. PCT/US2014/018027, mailed Sep. 4, 2014, 14 pages.

International Search Report and Written Opinion of the International Searching Authority, International Patent Application No. PCT/US2014/017374, mailed Sep. 8, 2014, 13 pages.

International Search Report and Written Opinion of the International Searching Authority, International Patent Application No. PCT/US2014/019395, mailed Sep. 9, 2014, 14 pages.

International Search Report and Written Opinion of the International Searching Authority, International Patent Application No. PCT/US2014/019469, mailed Sep. 12, 2014, 13 pages.

Feng, Jinwei et al., "A broadband self-tuning active noise equaliser", Signal Processing, Elsevier Science Publishers B.V. Amsterdam, NL, vol. 62, No. 2, Oct. 1, 1997, pp. 251-256.

Zhang, Ming et al., "A Robust Online Secondary Path Modeling Method with Auxiliary Noise Power Scheduling Strategy and Norm Constraint Manipulation", IEEE Transactions on Speech and Audio Processing, IEEE Service Center, New York, NY, vol. 11, No. 1, Jan. 1, 2003.

Lopez-Gaudana, Edgar et al., "A hybrid active noise cancelling with secondary path modeling", 51st Midwest Symposium on Circuits and Systems, 2008, MWSCAS 2008, Aug. 10, 2008, pp. 277-280.

Widrow, B. et al., Adaptive Noise Cancelling: Principles and Applications, Proceedings of the IEEE, IEEE, New York, NY, U.S., vol. 63, No. 13, Dec. 1975, pp. 1692-1716.

Morgan, Dennis R. et al., A Delayless Subband Adaptive Filter Architecture, IEEE Transactions on Signal Processing, IEEE Service Center, New York, NY, U.S., vol. 43, No. 8, Aug. 1995, pp. 1819-1829.

International Patent Application No. PCT/US2014/040999, International Search Report and Written Opinion, Oct. 18, 2014, 12 pages.

International Patent Application No. PCT/US2013/049407, International Search Report and Written Opinion, Jun. 18, 2014, 13 pages.

International Search Report and Written Opinion, International Application No. PCT/US2015/022113, mailed Jul. 23, 2015, 13 pages.

International Patent Application No. PCT/US2015/017124, International Search Report and Written Opinion, Jul. 13, 2015, 19 pages.

International Patent Application No. PCT/US2015/035073, International Search Report and Written Opinion, Oct. 8, 2015, 11 pages.

(56) References Cited

OTHER PUBLICATIONS

Parkins, et al., Narrowband and broadband active control in an enclosure using the acoustic energy density, J. Acoust. Soc. Am. Jul. 2000, pp. 192-203, vol. 108, issue 1, U.S.
Combined Search and Examination Report, Application No. GB1512832.5, mailed Jan. 28, 2016, 7 pages.
International Patent Application No. PCT/US2015/066260, International Search Report and Written Opinion, Apr. 21, 2016, 13 pages.
English machine translation of JP 2006-217542 A (Okumura, Hiroshi; Howling Suppression Device and Loudspeaker, published Aug. 2006).
Combined Search and Examination Report, Application No. GB1519000.2, mailed Apr. 21, 2016, 5 pages.

\* cited by examiner

SYSTEMS AND METHODS FOR ADAPTIVE NOISE CANCELLATION BY ADAPTIVELY SHAPING INTERNAL WHITE NOISE TO TRAIN A SECONDARY PATH

FIELD OF DISCLOSURE

The present disclosure relates in general to adaptive noise cancellation in connection with an acoustic transducer, and more particularly, to detection and cancellation of ambient noise present in the vicinity of the acoustic transducer, including biasing an anti-noise level for anti-noise generated by adaptive noise cancellation.

BACKGROUND

Wireless telephones, such as mobile/cellular telephones, cordless telephones, and other consumer audio devices, such as mp3 players, are in widespread use. Performance of such devices with respect to intelligibility can be improved by providing noise canceling using a microphone to measure ambient acoustic events and then using signal processing to insert an anti-noise signal into the output of the device to cancel the ambient acoustic events. Because the acoustic environment around personal audio devices such as wireless telephones can change dramatically, depending on the sources of noise that are present and the position of the device itself, it is desirable to adapt the noise canceling to take into account such environmental changes.

A typical adaptive noise cancellation (ANC) system may include a reference microphone for providing a reference microphone signal indicative of ambient audio sounds proximate to a personal audio device and an error microphone in proximity to a transducer for providing an error microphone signal indicative of the acoustic output of the transducer and the ambient audio sounds at the transducer. The typical ANC system may further include an adaptive feedforward filter that generates an anti-noise signal from the reference microphone signal to counter the effects of ambient audio sounds at an acoustic output of the transducer by adapting a response of an adaptive filter that filters an output of the reference microphone to minimize the ambient audio sounds in the error microphone signal based on a playback corrected error, wherein the playback corrected error is based on a difference between the error microphone signal and a secondary path estimate. In addition, the typical ANC system may include an adaptive secondary path estimate filter for modeling an electro-acoustic path of the source audio signal that generates a secondary path estimate from a source audio signal by adapting the response of the secondary path estimate adaptive filter to minimize the playback corrected error, wherein the playback corrected error is based on a difference between the error microphone signal and the secondary path estimate. The typical ANC system may combine the anti-noise signal with the source audio signal to generate an audio signal provided to the transducer.

Such an ANC system requires the source audio signal in order to properly adapt or "train" the response of the secondary path estimate filter. However, a disadvantage of training with a source audio signal may be that such signals may not have the persistence or spectral density required to effectively train the response of the secondary path estimate filter, in that a source audio signal may have silent intervals or may lack content in particular ranges of frequencies. Such disadvantage may particularly be present in stereo playback modes, as each channel of the stereo signal may convey only a portion of the source audio signal.

SUMMARY

In accordance with the teachings of the present disclosure, the disadvantages and problems associated with existing approaches to adaptive noise cancellation may be reduced or eliminated.

In accordance with embodiments of the present disclosure, a personal audio device may include a personal audio device housing, a transducer, a reference microphone, an error microphone, and a processing circuit. The transducer may be coupled to the housing for reproducing an audio signal including both a source audio signal for playback to a listener and an anti-noise signal for countering the effects of ambient audio sounds in an acoustic output of the transducer. The reference microphone may be coupled to the housing for providing a reference microphone signal indicative of the ambient audio sounds. The error microphone may be coupled to the housing in proximity to the transducer for providing an error microphone signal indicative of the acoustic output of the transducer and the ambient audio sounds at the transducer. The processing circuit may include an adaptive filter having a response that generates an anti-noise signal from the reference microphone signal, wherein the response is shaped in conformity with the reference microphone signal and a playback corrected error, and wherein the playback corrected error is based on a difference between the error microphone signal and a secondary path estimate. The processing circuit may also include a secondary path estimate filter configured to model an electro-acoustic path of the source audio signal and have a response that generates a secondary path estimate from the source audio signal, a secondary coefficient control block that shapes the response of the secondary path estimate filter in conformity with the source audio signal and the playback corrected error by adapting the response of the secondary path estimate filter to minimize the playback corrected error, and a noise injection portion for injecting a noise signal into the source audio signal, wherein the noise signal is shaped based on the playback corrected error.

In accordance with these and other embodiments of the present disclosure, a method for canceling ambient audio sounds in the proximity of a transducer of a personal audio device may include receiving a reference microphone signal indicative of the ambient audio sounds. The method may also include receiving an error microphone signal indicative of the output of the transducer and the ambient audio sounds at the transducer. The method may further include generating a source audio signal for playback to a listener. The method may additionally include generating an anti-noise signal, from a result of the measuring with the reference microphone, countering the effects of ambient audio sounds at an acoustic output of the transducer by adapting a response of an adaptive filter that filters an output of the reference microphone to minimize the ambient audio sounds in the error microphone signal. The method may also include adaptively generating a secondary path estimate, from a source audio signal, by filtering the source audio signal with a secondary path estimate adaptive filter configured to model an electro-acoustic path of the source audio signal and adapting the response of the secondary path estimate adaptive filter to minimize a playback corrected error, wherein the playback corrected error is based on a difference between the error microphone signal and the secondary path estimate. The method may further include injecting a noise signal into the source audio signal, wherein the noise signal is shaped based on the playback corrected error. The method may additionally include combining the anti-noise signal with the source audio signal to generate an audio signal provided to the transducer.

In accordance with these and other embodiments of the present disclosure, an integrated circuit for implementing at least a portion of a personal audio device may include an output, a reference microphone input, an error microphone input, and a processing circuit. The output may be for providing a signal to a transducer including both a source audio signal for playback to a listener and an anti-noise signal for countering the effect of ambient audio sounds in an acoustic output of the transducer. The reference microphone input may be for receiving a reference microphone signal indicative of the ambient audio sounds. The error microphone input may be for receiving an error microphone signal indicative of the output of the transducer and the ambient audio sounds at the transducer. The processing circuit may include an adaptive filter having a response that generates an anti-noise signal from the reference microphone signal, wherein the response is shaped in conformity with the reference microphone signal and a playback corrected error, and wherein the playback corrected error is based on a difference between the error microphone signal and a secondary path estimate. The processing circuit may also include a secondary path estimate filter configured to model an electro-acoustic path of the source audio signal and have a response that generates a secondary path estimate from the source audio signal, a secondary coefficient control block that shapes the response of the secondary path estimate filter in conformity with the source audio signal and the playback corrected error by adapting the response of the secondary path estimate filter to minimize the playback corrected error, and a noise injection portion for injecting a noise signal into the source audio signal, wherein the noise signal is shaped based on the playback corrected error.

Technical advantages of the present disclosure may be readily apparent to one skilled in the art from the figures, description and claims included herein. The objects and advantages of the embodiments will be realized and achieved at least by the elements, features, and combinations particularly pointed out in the claims.

It is to be understood that both the foregoing general description and the following detailed description are examples and explanatory and are not restrictive of the claims set forth in this disclosure.

BRIEF DESCRIPTION OF THE DRAWINGS

A more complete understanding of the present embodiments and advantages thereof may be acquired by referring to the following description taken in conjunction with the accompanying drawings, in which like reference numbers indicate like features, and wherein.

DETAILED DESCRIPTION

The present disclosure encompasses noise canceling techniques and circuits that can be implemented in a personal audio device, such as a wireless telephone. The personal audio device includes an ANC circuit that may measure the ambient acoustic environment and generate a signal that is injected in the speaker (or other transducer) output to cancel ambient acoustic events. A reference microphone may be provided to measure the ambient acoustic environment and an error microphone may be included for controlling the adaptation of the anti-noise signal to cancel the ambient audio sounds and for correcting for the electro-acoustic path from the output of the processing circuit through the transducer.

Figure 1:
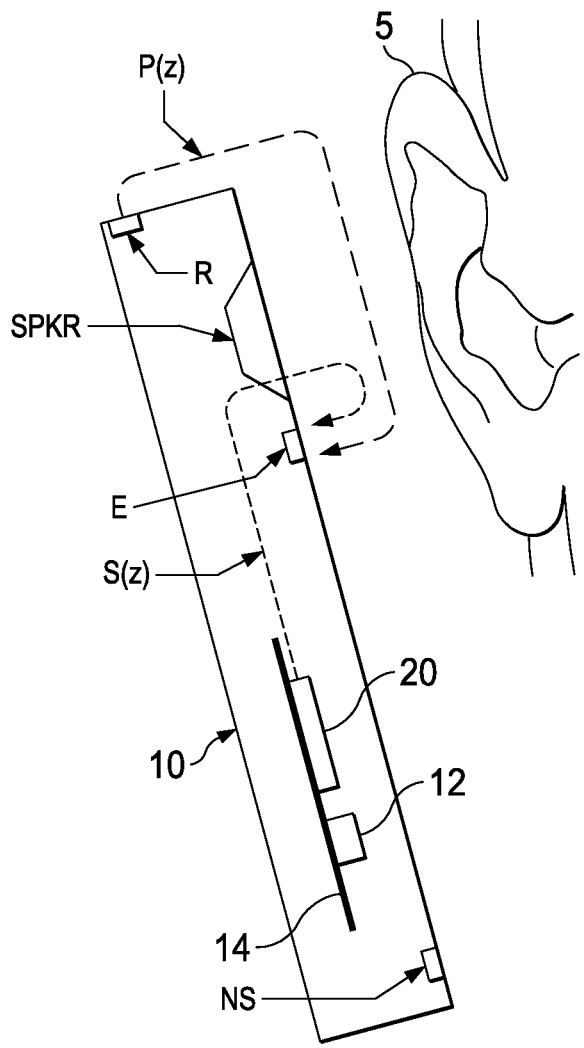
FIG. 1 is an illustration of an example wireless mobile telephone, in accordance with embodiments of the present disclosure.

Referring now to FIG. 1, a wireless telephone 10 as illustrated in accordance with embodiments of the present disclosure is shown in proximity to a human ear 5. Wireless telephone 10 is an example of a device in which techniques in accordance with embodiments of the invention may be employed, but it is understood that not all of the elements or configurations embodied in illustrated wireless telephone 10, or in the circuits depicted in subsequent illustrations, are required in order to practice the invention recited in the claims. Wireless telephone 10 may include a transducer such as speaker SPKR that reproduces distant speech received by wireless telephone 10, along with other local audio events such as ringtones, stored audio program material, injection of near-end speech (i.e., the speech of the user of wireless telephone 10) to provide a balanced conversational perception, and other audio that requires reproduction by wireless telephone 10, such as sources from webpages or other network communications received by wireless telephone 10 and audio indications such as a low battery indication and other system event notifications. A near-speech microphone NS may be provided to capture near-end speech, which is transmitted from wireless telephone 10 to the other conversation participant(s).

Wireless telephone 10 may include ANC circuits and features that inject an anti-noise signal into speaker SPKR to improve intelligibility of the distant speech and other audio reproduced by speaker SPKR. A reference microphone R may be provided for measuring the ambient acoustic environment, and may be positioned away from the typical position of a user's mouth, so that the near-end speech may be minimized in the signal produced by reference microphone R. Another microphone, error microphone E, may be provided in order to further improve the ANC operation by providing a measure of the ambient audio combined with the audio reproduced by speaker SPKR close to ear 5, when wireless telephone 10 is in close proximity to ear 5. Circuit 14 within wireless telephone 10 may include an audio CODEC integrated circuit (IC) 20 that receives the signals from reference microphone R, near-speech microphone NS, and error microphone E, and interfaces with other integrated circuits such as a radio-frequency (RF) integrated circuit 12 having a wireless telephone transceiver. In some embodiments of the disclosure, the circuits and techniques disclosed herein may be incorporated in a single integrated circuit that includes control circuits and other functionality for implementing the entirety of the personal audio device, such as an MP3 player-on-a-chip integrated circuit. In these and other embodiments, the circuits and techniques disclosed herein may be implemented partially or fully in software and/or firmware embodied in computer-readable media and executable by a controller or other processing device.

In general, ANC techniques of the present disclosure measure ambient acoustic events (as opposed to the output of speaker SPKR and/or the near-end speech) impinging on reference microphone R, and by also measuring the same ambient acoustic events impinging on error microphone E, ANC processing circuits of wireless telephone 10 adapt an anti-noise signal generated at the output of speaker SPKR from the output of reference microphone R to have a characteristic that minimizes the amplitude of the ambient acoustic events at error microphone E. Because acoustic path P(z) extends from reference microphone R to error microphone E, ANC circuits are effectively estimating acoustic path P(z) while removing effects of an electro-acoustic path S(z) that represents the response of the audio output circuits of CODEC IC 20 and the acoustic/electric transfer function of speaker SPKR including the coupling between speaker SPKR and error microphone E in the particular acoustic environment, which may be affected by the proximity and structure of ear 5 and other physical objects and human head structures that may be in proximity to wireless telephone 10, when wireless telephone 10 is not firmly pressed to ear 5. While the illustrated wireless telephone 10 includes a two-microphone ANC system with a third near-speech microphone NS, some aspects of the present invention may be practiced in a system that does not include separate error and reference microphones, or a wireless telephone that uses near-speech microphone NS to perform the function of the reference microphone R. Also, in personal audio devices designed only for audio playback, near-speech microphone NS will generally not be included, and the near-speech signal paths in the circuits described in further detail below may be omitted, without changing the scope of the disclosure, other than to limit the options provided for input to the microphone covering detection schemes. In addition, although only one reference microphone R and one error microphone E is depicted in FIG. 1, the circuits and techniques herein disclosed may be adapted, without changing the scope of the disclosure, to personal audio devices including a plurality of reference microphones and/or error microphones.

Figure 2:
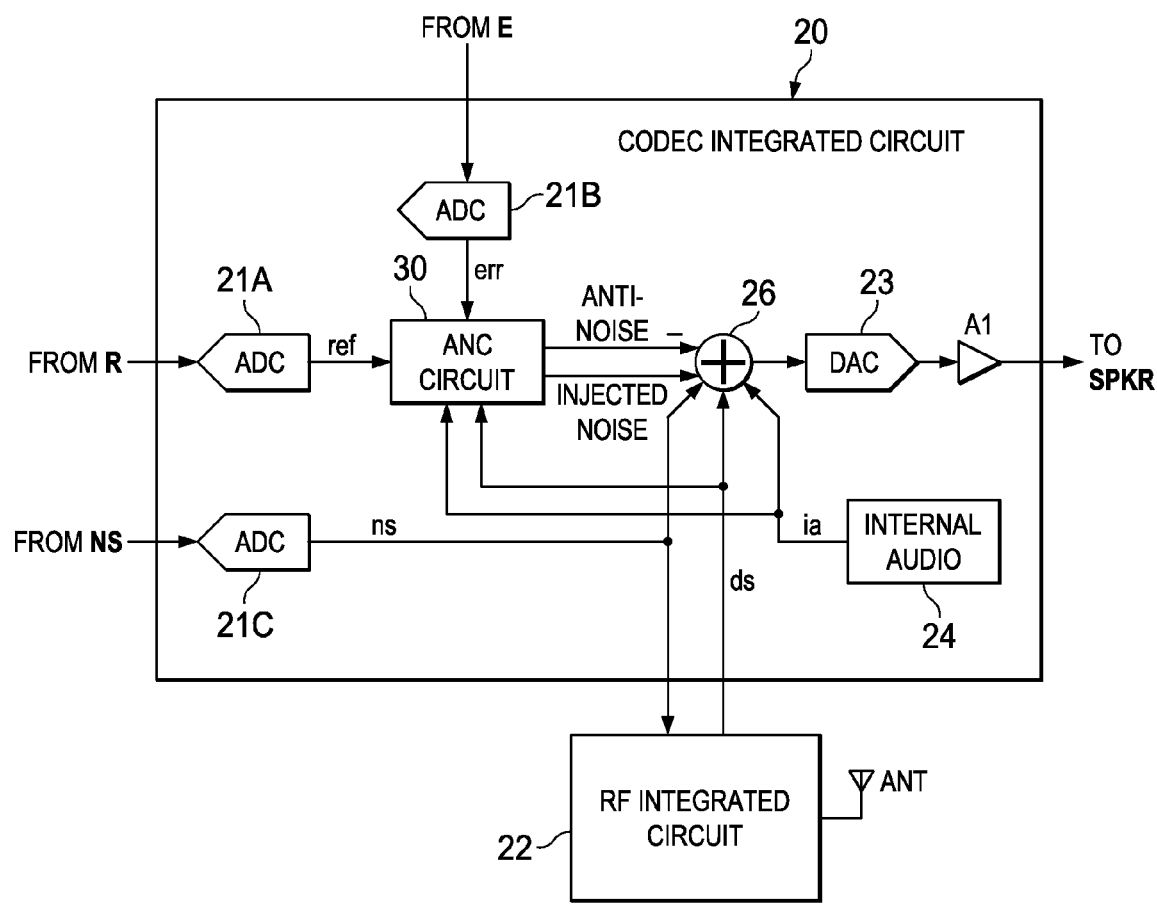
FIG. 2 is a block diagram of selected circuits within the wireless telephone depicted in FIG. 1, in accordance with embodiments of the present disclosure.

Referring now to FIG. 2, selected circuits within wireless telephone 10 are shown in a block diagram. CODEC IC 20 may include an analog-to-digital converter (ADC) 21A for receiving the reference microphone signal and generating a digital representation ref of the reference microphone signal, an ADC 21B for receiving the error microphone signal and generating a digital representation err of the error microphone signal, and an ADC 21C for receiving the near speech microphone signal and generating a digital representation ns of the near speech microphone signal. CODEC IC 20 may generate an output for driving speaker SPKR from an amplifier A1, which may amplify the output of a digital-to-analog converter (DAC) 23 that receives the output of a combiner 26. Combiner 26 may combine audio signals is from internal audio sources 24, the anti-noise signal generated by ANC circuit 30, which by convention has the same polarity as the noise in reference microphone signal ref and is therefore subtracted by combiner 26, the injected noise from ANC circuit 30, and a portion of near speech microphone signal ns so that the user of wireless telephone 10 may hear his or her own voice in proper relation to downlink speech ds, which may be received from radio frequency (RF) integrated circuit 22 and may also be combined by combiner 26. Near speech microphone signal ns may also be provided to RF integrated circuit 22 and may be transmitted as uplink speech to the service provider via antenna ANT.

Figure 3:
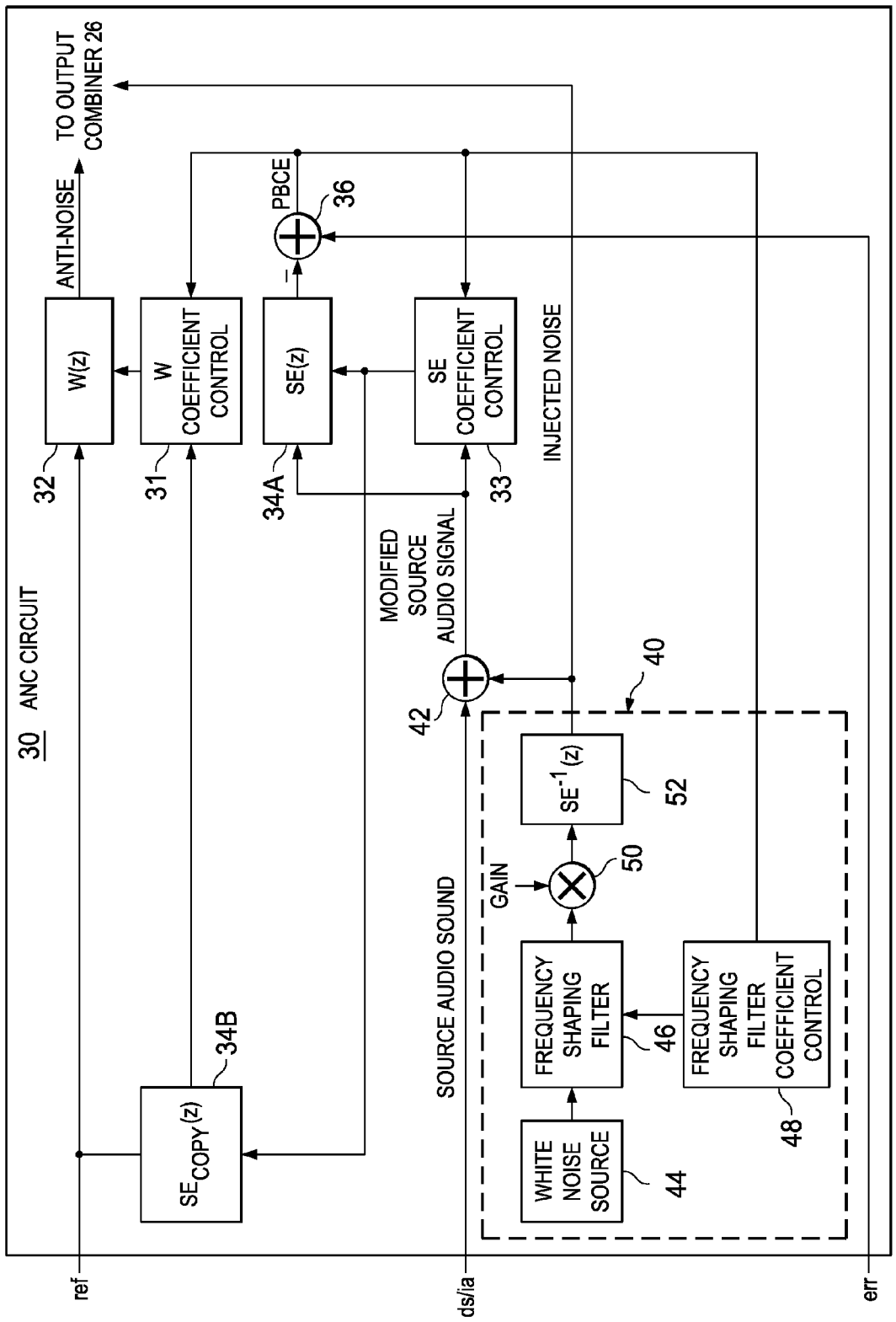
FIG. 3 is a block diagram depicting selected signal processing circuits and functional blocks within an example adaptive noise canceling (ANC) circuit of a coder-decoder (CODEC) integrated circuit of FIG. 2, in accordance with embodiments of the present disclosure.

Referring now to FIG. 3, details of ANC circuit 30 are shown in accordance with embodiments of the present disclosure. Adaptive filter 32 may receive reference microphone signal ref and under ideal circumstances, may adapt its transfer function W(z) to be P(z)/S(z) to generate the anti-noise signal, which may be provided to an output combiner that combines the anti-noise signal with the audio to be reproduced by the transducer, as exemplified by combiner 26 of FIG. 2. The coefficients of adaptive filter 32 may be controlled by a W coefficient control block 31 that uses a correlation of signals to determine the response of adaptive filter 32, which generally minimizes the error, in a least-mean squares sense, between those components of reference microphone signal ref present in error microphone signal err. The signals compared by W coefficient control block 31 may be the reference microphone signal ref as shaped by a copy of an estimate of the response of path S(z) provided by filter 34B and a playback corrected error, labeled as "PBCE" in FIG. 3, based at least in part on error microphone signal err. The playback corrected error may be generated as described in greater detail below.

By transforming reference microphone signal ref with a copy of the estimate of the response of path S(z), response $SE_{COPY}(z)$ of filter 34B, and minimizing the difference between the resultant signal and error microphone signal err, adaptive filter 32 may adapt to the desired response of P(z)/S(z). In addition to error microphone signal err, the signal compared to the output of filter 34B by W coefficient control block 31 may include an inverted amount of modified source audio signal (e.g., downlink audio signal ds and/or internal audio signal ia, which may be combined with a noise signal generated by noise injection portion 40), that has been processed by filter response SE(z), of which response $SE_{COPY}(z)$ is a copy. By injecting an inverted amount of source audio signal, adaptive filter 32 may be prevented from adapting to the relatively large amount of source audio signal present in error microphone signal err. However, by transforming that inverted copy of source audio signal with the estimate of the response of path S(z), the source audio that is removed from error microphone signal err should match the expected version of the source audio signal reproduced at error microphone signal err, because the electrical and acoustical path of S(z) is the path taken by the source audio signal to arrive at error microphone E. Filter 34B may not be an adaptive filter, per se, but may have an adjustable response that is tuned to match the response of adaptive filter 34A, so that the response of filter 34B tracks the adapting of adaptive filter 34A.

To implement the above, adaptive filter 34A may have coefficients controlled by SE coefficient control block 33, which may compare a modified source audio signal and a playback corrected error. The modified source audio signal may include the source audio signal (e.g., downlink audio signal ds and/or internal audio signal ia) with injected noise generated by noise injection portion 40 and combined with the sum source audio signal by combiner 42. The playback corrected error may be equal to error microphone signal err after removal of the source audio signal (as filtered by adaptive filter 34A to represent the expected playback audio delivered to error microphone E) by a combiner 36. SE coefficient control block 33 may correlate the actual modified source audio signal with the components of the modified source audio signal that are present in error microphone signal err. Adaptive filter 34A may thereby be adapted to generate a secondary estimate signal from the modified source audio signal, that when subtracted from error microphone signal err to generate the playback corrected error, includes the content of error microphone signal err that is not due to the modified source audio signal.

As shown in FIG. 2, ANC circuit 30 may also generate an injected noise signal that may be combined with near-speech signal ns, the source audio signal, and the anti-noise (e.g., by combiner 26). Generation of such injected noise signal is discussed in greater detail with respect to FIG. 3, below.

As shown in FIG. 3, the noise signal combined with the source audio signal may be generated by noise injection portion 40. Noise injection portion 40 may include a white noise source 44 for generating white noise (e.g., an audio signal with a constant amplitude across all frequencies of interest, such as those frequencies within the range of human hearing). A frequency shaping filter 46 may generate the noise signal by filtering the white noise signal, wherein a response of the frequency shaping filter is shaped by frequency shaping filter coefficient control block 48 in conformity with the playback corrected error. In some embodiments, coefficient control block 48 implements an adaptive linear prediction coefficient system which estimates a frequency spectrum of the playback corrected error. Accordingly, the noise signal generated by frequency shaping filter 46 may comprise the white noise signal filtered such that the white noise signal is attenuated or eliminated in those frequencies within the frequency spectrum of the playback corrected error.

In some embodiments, noise injection portion 40 may include a gain element 50 configured to attenuate the noise signal to an amplitude substantially below an amplitude of the error microphone signal err such that the noise signal is substantially imperceptible to the listener. In these and other embodiments, noise injection portion 40 may include an inverse secondary path estimate filter 52 having a response inverse to the response of the secondary path estimate filter, wherein inverse secondary path estimate filter 52 applies its response to the noise signal before injection of the noise signal into the source audio signal, in order to undo the effect on the noise signal of the secondary path S(z) and the secondary path estimate SE(z) of filter 34A.

As a result, the modified source audio signal including the noise signal may have spectral content in all frequency ranges of interest due to the injected noise signal, but the injected noise signal may be of an intensity low enough such that it is not perceptible to a listener, thus providing a broadband signal which SE coefficient control block 33 may use to adapt the response SE(z), while minimally affecting listener experience.

Although the embodiments shown in FIG. 2 and FIG. 3 contemplate that source audio signal, injected noise signal, and anti-noise signal are combined at combiner 26, in some embodiments, the modified source audio signal (including the combination of the source audio signal and injected noise) may instead be combined with the anti-noise signal at combiner 26.

This disclosure encompasses all changes, substitutions, variations, alterations, and modifications to the exemplary embodiments herein that a person having ordinary skill in the art would comprehend. Similarly, where appropriate, the appended claims encompass all changes, substitutions, variations, alterations, and modifications to the exemplary embodiments herein that a person having ordinary skill in the art would comprehend. Moreover, reference in the appended claims to an apparatus or system or a component of an apparatus or system being adapted to, arranged to, capable of, configured to, enabled to, operable to, or operative to perform a particular function encompasses that apparatus, system, or component, whether or not it or that particular function is activated, turned on, or unlocked, as long as that apparatus, system, or component is so adapted, arranged, capable, configured, enabled, operable, or operative.

All examples and conditional language recited herein are intended for pedagogical objects to aid the reader in understanding the invention and the concepts contributed by the inventor to furthering the art, and are construed as being without limitation to such specifically recited examples and conditions. Although embodiments of the present inventions have been described in detail, it should be understood that various changes, substitutions, and alterations could be made hereto without departing from the spirit and scope of the disclosure.

What is claimed is:

1. A personal audio device comprising:
   a personal audio device housing;
   a transducer coupled to the housing for reproducing an audio signal including both a source audio signal for playback to a listener and an anti-noise signal for countering the effects of ambient audio sounds in an acoustic output of the transducer;
   a reference microphone coupled to the housing for providing a reference microphone signal indicative of the ambient audio sounds;
   an error microphone coupled to the housing in proximity to the transducer for providing an error microphone signal indicative of the acoustic output of the transducer and the ambient audio sounds at the transducer; and
   a processing circuit comprising:
      an adaptive filter having a response that generates an anti-noise signal from the reference microphone signal, wherein the response is shaped in conformity with the reference microphone signal and a playback corrected error, and wherein the playback corrected error is based on a difference between the error microphone signal and a secondary path estimate;
      a secondary path estimate filter configured to model an electro-acoustic path of the source audio signal and have a response that generates the secondary path estimate from the source audio signal;
      a secondary coefficient control block that shapes the response of the secondary path estimate filter in conformity with the source audio signal and the playback corrected error by adapting the response of the secondary path estimate filter to minimize the playback corrected error; and
      a noise injection portion for injecting a noise signal into the source audio signal, wherein the noise signal is shaped based on the playback corrected error, wherein the noise injection portion comprises:
         a noise source;
         a frequency shaping filter having a response that generates the noise signal from the noise source and shapes the noise signal in conformity with the playback corrected error; and
         a filter that shapes the noise signal in conformity with at least one parameter of the secondary path estimate filter in order to reduce audibility of the noise signal in the audio signal reproduced by the transducer; and wherein a response of the noise injection portion includes a response that is an inverse of at least a portion of the response of the secondary path estimate filter.

2. The personal audio device of claim 1, wherein the noise injection portion comprises a gain element configured to attenuate the noise signal to an amplitude substantially below an amplitude of the error microphone signal such that the noise signal is substantially imperceptible to the listener.

3. The personal audio device of claim 1, wherein the noise injection portion comprises an inverse secondary path estimate filter having a response inverse to the response of the secondary path estimate filter, wherein the inverse secondary path estimate filter applies its response to the noise signal before injection of the noise signal into the source audio signal.

4. The personal audio device of claim 1, wherein the noise injection portion comprises:
a gain element configured to attenuate the noise signal to an amplitude substantially below an amplitude of the error microphone signal such that the noise signal is substantially imperceptible to the listener; and
an inverse secondary path estimate filter having a response inverse to the response of the secondary path estimate filter, wherein the inverse secondary path estimate filter applies its response to the noise signal before injection of the noise signal into the source audio signal.

5. The personal audio device of claim 1, wherein the coefficient control block is further configured to analyze the error signal to determine frequency content of the error microphone signal and adaptively control a frequency response of the noise shaping filter in conformity with frequency content of the error signal.

6. The personal audio device of claim 5, wherein the at least one parameter comprises parameters determinative of the response of the secondary path estimate filter.

7. The personal audio device of claim 5, wherein a gain of a response of the noise injection portion is set in conformity with an inverse of a magnitude of the response of the secondary path estimate filter over at least a portion of the response of the secondary path estimate filter.

8. A method for canceling ambient audio sounds in the proximity of a transducer of a personal audio device, the method comprising:
receiving a reference microphone signal indicative of the ambient audio sounds;
receiving an error microphone signal indicative of the output of the transducer and the ambient audio sounds at the transducer;
generating a source audio signal for playback to a listener;
generating an anti-noise signal, from the reference microphone signal, countering the effects of ambient audio sounds at an acoustic output of the transducer by adapting a response of an adaptive filter that filters an output of the reference microphone to minimize the ambient audio sounds in the error microphone signal;
adaptively generating a secondary path estimate, from the source audio signal, by filtering the source audio signal with a secondary path estimate adaptive filter configured to model an electro-acoustic path of the source audio signal and adapting the response of the secondary path estimate adaptive filter to minimize a playback corrected error, wherein the playback corrected error is based on a difference between the error microphone signal and the secondary path estimate;
injecting a noise signal into the source audio signal with a noise injection portion, wherein the noise signal is generated by filtering an output of a noise source with a frequency shaping filter in conformity with the playback corrected error and filtering the noise signal in conformity with at least one parameter of the secondary path estimate filter by filtering the noise signal with a response that is an inverse of at least a portion of the response of the secondary path estimate filter in order to reduce audibility of the noise signal in the audio signal reproduced by the transducer; and
combining the anti-noise signal with the source audio signal to generate an audio signal provided to the transducer.

9. The method of claim 8, further comprising attenuating the noise signal to an amplitude substantially below an amplitude of the error microphone signal such that the noise signal is substantially imperceptible to the listener.

10. The method of claim 8, further comprising applying a response of an inverse secondary path estimate filter response to the noise signal before injection of the noise signal into the source audio signal, wherein the inverse secondary path estimate filter response is inverse to the response of the secondary path estimate filter.

11. The method of claim 8, further comprising:
attenuating the noise signal to an amplitude substantially below an amplitude of the error microphone signal such that the noise signal is substantially imperceptible to the listener; and
applying a response of an inverse secondary path estimate filter response to the noise signal before injection of the noise signal into the source audio signal, wherein the inverse secondary path estimate filter response is inverse to the response of the secondary path estimate filter.

12. The method of claim 8, further comprising analyzing the error signal to determine frequency content of the error microphone signal and adaptively controlling a frequency response of the noise shaping filter in conformity with frequency content of the error signal.

13. The method of claim 12, wherein the at least one parameter comprises parameters determinative of the response of the secondary path estimate filter.

14. The method of claim 12, wherein a gain of a response of the noise injection portion is set in conformity with an inverse of a magnitude of the response of the secondary path estimate filter over at least a portion of the response of the secondary path estimate filter.

15. An integrated circuit for implementing at least a portion of a personal audio device, comprising:
an output for providing a signal to a transducer including both a source audio signal for playback to a listener and an anti-noise signal for countering the effect of ambient audio sounds in an acoustic output of the transducer;
a reference microphone input for receiving a reference microphone signal indicative of the ambient audio sounds;
an error microphone input for receiving an error microphone signal indicative of the output of the transducer and the ambient audio sounds at the transducer; and
a processing circuit comprising:
an adaptive filter having a response that generates an anti-noise signal from the reference microphone signal, wherein the response is shaped in conformity with the reference microphone signal and a playback corrected error, and wherein the playback corrected error is based on a difference between the error microphone signal and a secondary path estimate;

a secondary path estimate filter configured to model an electro-acoustic path of the source audio signal and have a response that generates the secondary path estimate from the source audio signal;

a secondary coefficient control block that shapes the response of the secondary path estimate filter in conformity with the source audio signal and the playback corrected error by adapting the response of the secondary path estimate filter to minimize the playback corrected error; and a noise injection portion for injecting a noise signal into the source audio signal, wherein the noise signal is shaped based on the playback corrected error, wherein the noise injection portion comprises:
   a noise source;
   a frequency shaping filter having a response that generates the noise signal from the noise source and shapes the noise signal in conformity with the playback corrected error; and
   a filter that shapes the noise signal in conformity with at least one parameter of the secondary path estimate filter in order to reduce audibility of the noise signal in the audio signal reproduced by the transducer; and wherein a response of the noise injection portion includes a response that is an inverse of at least a portion of the response of the secondary path estimate filter.

16. The integrated circuit of claim 15, wherein the noise injection portion comprises a gain element configured to attenuate the noise signal to an amplitude substantially below an amplitude of the error microphone signal such that the noise signal is substantially imperceptible to the listener.

17. The integrated circuit of claim 15, wherein the noise injection portion comprises an inverse secondary path estimate filter having a response inverse to the response of the secondary path estimate filter, wherein the inverse secondary path estimate filter applies its response to the noise signal before injection of the noise signal into the source audio signal.

18. The integrated circuit of claim 15, wherein the noise injection portion comprises:
   a gain element configured to attenuate the noise signal to an amplitude substantially below an amplitude of the error microphone signal such that the noise signal is substantially imperceptible to the listener; and
   an inverse secondary path estimate filter having a response inverse to the response of the secondary path estimate filter, wherein the inverse secondary path estimate filter applies its response to the noise signal before injection of the noise signal into the source audio signal.

19. The integrated circuit of claim 15, wherein the coefficient control block is further configured to analyze the error signal to determine frequency content of the error microphone signal and adaptively control a frequency response of the noise shaping filter in conformity with frequency content of the error signal.

20. The integrated circuit of claim 19, wherein the at least one parameter comprises parameters determinative of the response of the secondary path estimate filter.

21. The integrated circuit of claim 19, wherein a gain of a response of the noise injection portion is set in conformity with an inverse of a magnitude of the response of the secondary path estimate filter over at least a portion of the response of the secondary path estimate filter.

* * * * *